US009257198B2

(12) United States Patent
Yan

(10) Patent No.: US 9,257,198 B2
(45) Date of Patent: Feb. 9, 2016

(54) SHIFT REGISTER UNIT, SHIFT REGISTER, GATE DRIVE CIRCUIT AND DISPLAY APPARATUS

(71) Applicants: BOE TECHNOLOGY GROUP CO., LTD., Beijing (CN); BEIJING BOE DISPLAY TECHNOLOGY CO., LTD., Beijing (CN)

(72) Inventor: Yan Yan, Beijing (CN)

(73) Assignees: BOE TECHNOLOGY GROUP CO., LTD., Beijing (CN); BEIJING BOE DISPLAY TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 14/548,920

(22) Filed: Nov. 20, 2014

(65) Prior Publication Data
US 2015/0332784 A1 Nov. 19, 2015

(30) Foreign Application Priority Data

May 19, 2014 (CN) .......................... 2014 1 0211188

(51) Int. Cl.
*H01L 27/148* (2006.01)
*G11C 19/28* (2006.01)
*G09G 3/36* (2006.01)

(52) U.S. Cl.
CPC .............. *G11C 19/28* (2013.01); *G09G 3/3611* (2013.01); *G09G 2310/0286* (2013.01)

(58) Field of Classification Search
CPC ..................... H01L 2251/558; H01L 51/0096; H01L 51/5036; H01L 51/5206; H01L 51/5221; H01L 51/5246; H01L 51/5253; H01L 51/5259; H01L 51/5268; H01L 51/5275

USPC .............. 377/64, 75; 257/43, 59, 72, 80, 214, 257/789
See application file for complete search history.

(56) References Cited

U.S. PATENT DOCUMENTS

2010/0166136 A1* 7/2010 Tobita .................. G11C 19/184
377/67
2012/0235155 A1* 9/2012 Yamazaki ........... H01L 27/3244
257/72

(Continued)

FOREIGN PATENT DOCUMENTS

CN 102903323 A 1/2013
CN 103021309 A 4/2013

(Continued)

OTHER PUBLICATIONS

Chinese Office Action dated Oct. 23, 2015 issued in corresponding Chinese Application No. 201410211188.4.

*Primary Examiner* — Mark A Laurenzi
(74) *Attorney, Agent, or Firm* — Nath, Goldberg & Meyer; Joshua B. Goldberg

(57) ABSTRACT

To provide a shift register unit, which comprises a positive control signal input terminal, a reverse control signal input terminal, a first thin film transistor, a second thin film transistor, a positive input terminal, a reverse input terminal, a pull-up module and a first reset module, a gate of the first thin film transistor is connected with the positive input terminal, a first electrode of the first thin film transistor is connected with the positive control signal input terminal, a second electrode of the first thin film transistor is connected with a pull-up node of the pull-up module, a gate of the second thin film transistor is connected with the reverse input terminal, a first electrode of the second thin film transistor is connected with the pull-up node of the pull-up module, a second electrode of the second thin film transistor is connected with the reverse control signal input terminal.

8 Claims, 5 Drawing Sheets

(56) References Cited

U.S. PATENT DOCUMENTS

2014/0064439 A1* 3/2014 Qing ................. G11C 19/28
377/75
2014/0118237 A1 5/2014 Wang

FOREIGN PATENT DOCUMENTS

| CN | 103187040 A | 7/2013 |
| CN | 103680452 A | 3/2014 |
| CN | 103680636 A | 3/2014 |

* cited by examiner

SHIFT REGISTER UNIT, SHIFT REGISTER, GATE DRIVE CIRCUIT AND DISPLAY APPARATUS

FIELD OF THE INVENTION

The present invention relates to the field of liquid crystal display technology, and particularly, to a shift register unit, a shift register comprising the shift register unit, a gate drive circuit comprising the shift register and a display apparatus comprising the gate drive circuit.

BACKGROUND OF THE INVENTION

During displaying with a liquid crystal display, an image is displayed by outputting a signal from a drive circuit inside the liquid crystal display and scanning pixel units of the liquid crystal display line by line. In a liquid crystal display, scanning for an image line by line is mainly realized by a shift register. FIG. 1 shows a structural diagram of a shift register in the prior art. As shown in FIG. 1, the shift register comprises shift register units connected in multiple stages, a low voltage supply line connected with a low level input terminal VSS, a first clock signal supply line connected with a first clock signal input terminal CLK and a second clock signal supply line connected with a second clock signal input terminal CLKB, wherein, a signal from an output terminal OUTPUT of a shift register unit in $n^{th}$ stage is provided to a reset terminal RESET of a shift register unit in $(n-1)^{th}$ stage as a reset signal, and is provided to an input terminal INPUT of a shift register unit in $(n+1)^{th}$ stage as an input signal.

However, only a method of scanning in a single direction from top to bottom can be realized by such a shift register, so that a liquid crystal display provided with such a shift register has a single display mode, display flexibility thereof is poor, and different requirements for display cannot be satisfied.

Therefore, how to realize a bidirectional scanning for a liquid crystal display becomes a technical problem to be solved in the art.

SUMMARY OF THE INVENTION

In view of above, an objective of the present invention is to provide a shift register unit, a shift register, a gate drive circuit and a display apparatus to realize a bidirectional scanning.

The present invention provides a shift register unit comprising a positive control signal input terminal, a reverse control signal input terminal, a first thin film transistor, a second thin film transistor, a positive input terminal, a reverse input terminal, a pull-up module and a first reset module, a gate of the first thin film transistor is connected with the positive input terminal, a first electrode of the first thin film transistor is connected with the positive control signal input terminal, a second electrode of the first thin film transistor is connected with a pull-up node of the pull-up module, a gate of the second thin film transistor is connected with the reverse input terminal, a first electrode of the second thin film transistor is connected with the pull-up node of the pull-up module, a second electrode of the second thin film transistor is connected with the reverse control signal input terminal, wherein:

during a positive scanning, a high level signal is inputted from the positive control signal input terminal, and a low level signal is inputted from the reverse control signal input terminal, during a pre-charging phase of the positive scanning, a high level signal is inputted from the positive input terminal, and a low level signal is inputted from the reverse input terminal, during a reset phase of the positive scanning, a high level signal is inputted from the reverse input terminal; and during a reverse scanning, a low level signal is inputted from the positive control signal input terminal, and a high level signal is inputted from the reverse control signal input terminal, during a pre-charging phase of the reverse scanning, a high level signal is inputted from the reverse input terminal, and a low level signal is inputted from the positive input terminal, during a reset phase of the reverse scanning, a high level signal is inputted from the positive input terminal.

Preferably, the first reset module comprises a fourth thin film transistor and a fourteenth thin film transistor, wherein, a gate of the fourth thin film transistor is connected with the reverse input terminal, a first electrode of the fourth thin film transistor is connected with an output terminal of the shift register unit, a second electrode of the fourth thin film transistor is connected with a low level input terminal; a gate of the fourteenth thin film transistor is connected with the positive input terminal, a first electrode of the fourteenth thin film transistor is connected with the output terminal of the shift register unit, a second electrode of the fourteenth thin film transistor is connected with the low level input terminal.

Preferably, the pull-up module comprises a third thin film transistor, a gate of the third thin film transistor is connected with the pull-up node, a first electrode of the third thin film transistor is connected with a first clock signal input terminal, and a second electrode of the third thin film transistor is connected with the output terminal of the shift register unit.

Preferably, the shift register unit further comprises a second reset module, and the second reset module comprises:

a fifth thin film transistor, a gate of the fifth thin film transistor being connected with a pull-down control node, a first electrode of the fifth thin film transistor being connected with a second clock signal input terminal, and a second electrode of the fifth thin film transistor being connected with a pull-down node;

a sixth thin film transistor, a gate of the sixth thin film transistor being connected with the pull-up node, a first electrode of the sixth thin film transistor being connected with the pull-down node, and a second electrode of the sixth thin film transistor being connected with the low level input terminal;

an eighth thin film transistor, a gate of the eighth thin film transistor being connected with the pull-up node, a first electrode of the eighth thin film transistor being connected with the pull-down control node, and a second electrode of the eighth thin film transistor being connected with the low level input terminal;

a ninth thin film transistor, a gate and a first electrode of the ninth thin film transistor being connected with the second clock signal input terminal, and a second electrode of the ninth thin film transistor being connected with the pull-down control node;

a tenth thin film transistor, a gate of the tenth thin film transistor being connected with the pull-down node, a first electrode of the tenth thin film transistor being connected with the pull-up node, and a second electrode of the tenth thin film transistor being connected with the low level input terminal;

an eleventh thin film transistor, a gate of the eleventh thin film transistor being connected with the pull-down node, a first electrode of the eleventh thin film transistor being connected with the output terminal of the shift register unit, and a second electrode of the eleventh thin film transistor being connected with the low level input terminal; and a twelfth thin film transistor, a gate of the twelfth thin film transistor being connected with the second clock signal input terminal, a first electrode of the twelfth thin film transistor being connected with the output terminal of the shift register unit, and a second electrode of the twelfth thin film transistor being connected with the low level input terminal.

Preferably, the output terminal of the shift register unit comprises a first output terminal and a second output terminal, the shift register unit further comprises a fifteenth thin film transistor, a gate of the fifteenth thin film transistor is connected with the pull-up node, a first electrode of the fifteenth thin film transistor is connected with the first clock signal input terminal, and a second electrode of the fifteenth thin film transistor is connected with the second output terminal; the second electrode of the third thin film transistor, the first electrode of the fourth thin film transistor, the first electrode of the eleventh thin film transistor, the first electrode of the twelfth thin film transistor and the first electrode of the fourteenth thin film transistor are connected with the first output terminal.

Correspondingly, the present invention also provides a shift register comprising at least three stages of shift register units, and each of the shift register units is the above shift register unit of the present invention, wherein, among the shift register units connected successively in three stages, the output terminal of the shift register unit in an intermediate stage is connected with the positive input terminal of the shift register unit in the next stage and the reverse input terminal of the shift register unit in the upper stage.

Preferably, the output terminal of the shift register unit comprises a first output terminal and a second output terminal, and among the shift register units connected successively in three stages, the second output terminal of the shift register unit in an intermediate stage is connected with the positive input terminal of the shift register unit in the next stage and the reverse input terminal of the shift register unit in the upper stage.

Correspondingly, the present invention provides a gate drive circuit comprising a shift register, wherein the shift register is the above shift register of the present invention.

Correspondingly, the present invention also provides a display apparatus comprising a gate drive circuit, wherein the gate drive circuit is the above gate drive circuit of the present invention.

In the present invention, during the positive scanning, the high level signal inputted from the positive input terminal is used as a scan signal, the high level signal inputted from the reverse input terminal is used as a reset signal; during the reverse scanning, the high level signal inputted from the reverse input terminal is used as a scan signal, the high level signal inputted from the positive input terminal is used as a reset signal, so that a bidirectional scanning is achieved. Meanwhile, the output terminal of the shift register unit in the present invention comprises the first output terminal and the second output terminal, so that a trigger signal is individually provided to the shift register unit in the next stage, thereby effectively avoiding an emergence of a signal delay phenomenon.

BRIEF DESCRIPTION OF THE DRAWINGS

Drawings which constitute a part of description are used for providing further understanding of the present invention and for explaining the present invention in conjunction with following embodiments, but not for limiting the present invention. In the drawings.

DETAILED DESCRIPTION OF EMBODIMENTS

Hereinafter, specific embodiments of the present invention will be described in detail with reference to the accompanying drawings. It should be understood that the specific embodiments described herein are only intended to illustrate and explain the present invention and are not intended to limit the present invention.

Figure 1:
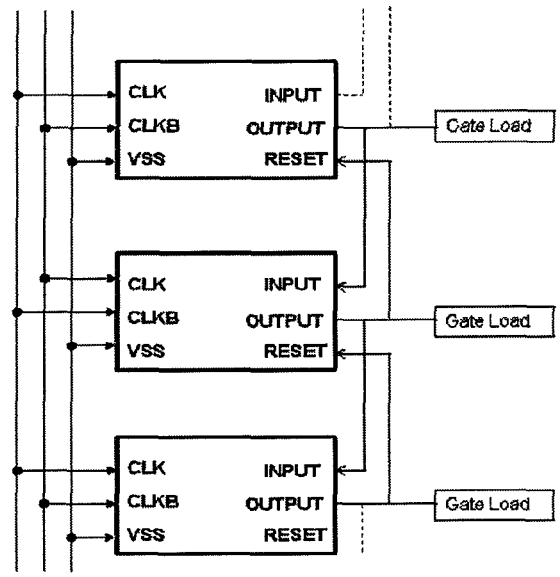
FIG. 1 shows a structural diagram of a shift register in the prior art.
Figure 2:
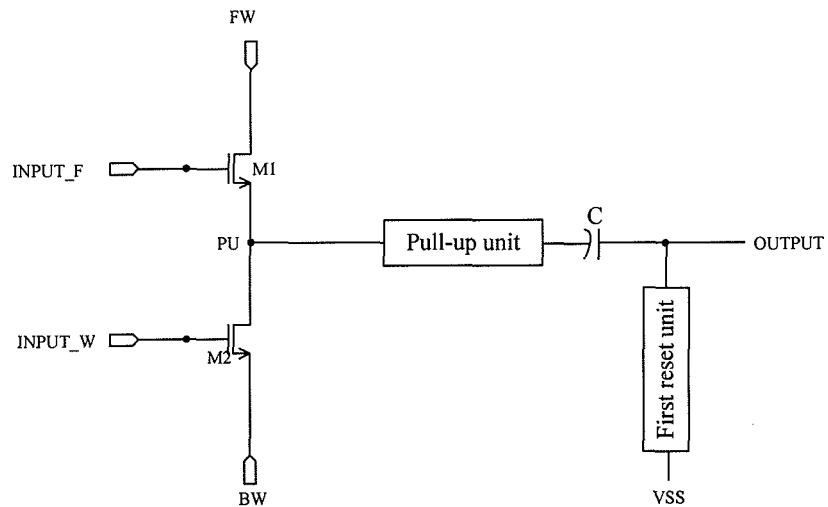
FIG. 2 shows a first structural diagram of a shift register unit according to the present invention.
Figure 3:
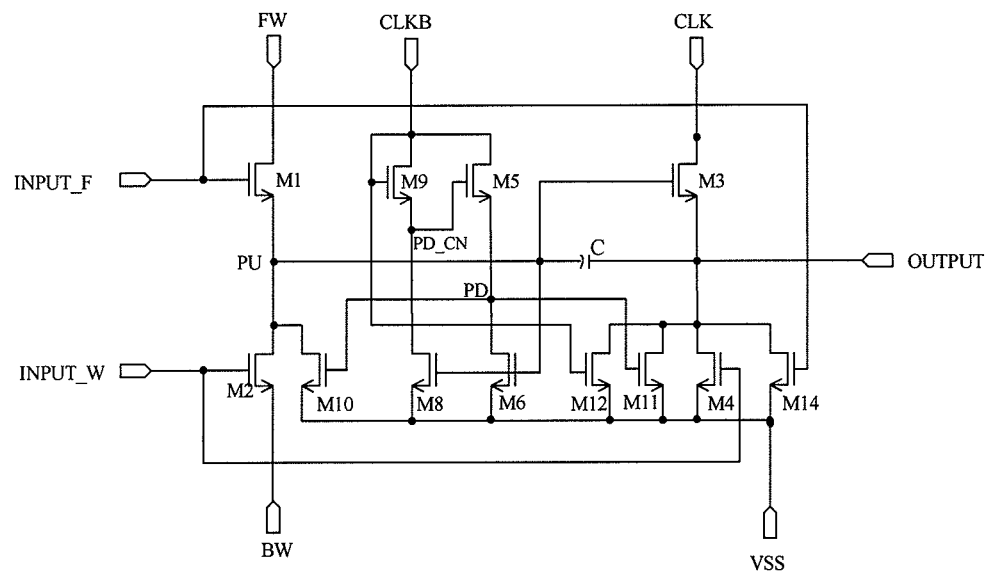
FIG. 3 shows a second structural diagram of a shift register unit according to the present invention.
Figure 4:
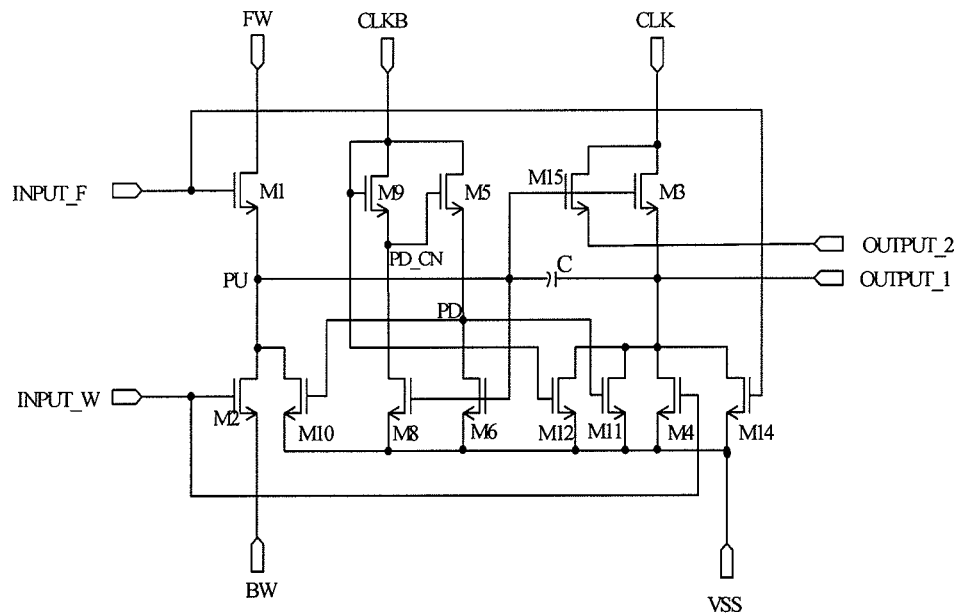
FIG. 4 shows a third structural diagram of a shift register unit according to the present invention.

The present invention provides a shift register unit. As shown in FIGS. 2 to 4, the shift register unit may comprise a positive control signal input terminal FW, a reverse control signal input terminal BW, a first thin film transistor M1, a second thin film transistor M2, a positive input terminal INPUT_F, a reverse input terminal INPUT_W, a pull-up module 1 and a first reset module 2, a gate of the first thin film transistor M1 is connected with the positive input terminal INPUT_F, a first electrode of the first thin film transistor M1 is connected with the positive control signal input terminal FW, a second electrode of the first thin film transistor M1 is connected with a pull-up node PU of the pull-up module, a gate of the second thin film transistor M2 is connected with the reverse input terminal INPUT_W, a first electrode of the second thin film transistor M2 is connected with the pull-up node PU of the pull-up module, a second electrode of the second thin film transistor M2 is connected with the reverse control signal input terminal BW.

During a positive scanning, a high level signal is inputted from the positive control signal input terminal FW, and a low level signal is inputted from the reverse control signal input terminal BW. During a pre-charging phase of the positive scanning, a high level signal is inputted from the positive input terminal INPUTS, and a low level signal is inputted from the reverse input terminal INPUT_W. During a reset phase of the positive scanning, a high level signal is inputted from the reverse input terminal INPUT_W.

During a reverse scanning, a low level signal is inputted from the positive control signal input terminal FW, and a high level signal is inputted from the reverse control signal input terminal BW. During a pre-charging phase of the reverse scanning, a high level signal is inputted from the reverse input terminal INPUT_W, and a low level signal is inputted from the positive input terminal INPUT_F. During a reset phase of the reverse scanning, a high level signal is inputted from the positive input terminal INPUT_F.

In the present invention, during the positive scanning, a high level signal is inputted into the shift register unit through the positive control signal input terminal FW, and a low level signal is inputted into the shift register unit through the reverse control signal input terminal BW, thus during the pre-charging phase of the positive scanning, a high level signal is inputted from the positive input terminal INPUT_F, the first thin film transistor M1 is turned on, and the pull-up node PU is charged from the positive control signal input terminal FW through the first thin film transistor M1. During an evaluation phase of the positive scanning, a high level signal is outputted from an output terminal OUTPUT of the shift register unit. During the reset phase of the positive scanning, a high level signal is inputted from the reverse input terminal INPUT_W, the second thin film transistor M2 is turned on, the pull-up node PU is discharged to the reverse control signal input terminal BW through the second thin film transistor M2, a storage capacitor C is discharged to a low level input terminal VSS through the first reset module 2. During the reverse scanning, a low level signal is inputted into the shift register unit through the positive control signal input terminal FW, and a high level signal is inputted into the shift register unit through the reverse control signal input terminal BW, thus, during the pre-charging phase of the reverse scanning, a high level signal is inputted from the reverse input terminal INPUT_W, the second thin film transistor M2 is turned on, and the pull-up node PU is charged from the reverse control signal input terminal BW through the second thin film transistor M2. During an evaluation phase of the reverse scanning, a high level signal is outputted from the output terminal OUTPUT of the shift register unit. During the reset phase of the reverse scanning, a high level signal is inputted from the positive input terminal INPUT_F, the first thin film transistor M1 is turned on, the pull-up node PU is discharged to the positive control signal input terminal FW through the first thin film transistor M1, the storage capacitor C is discharged to the low level input terminal VSS through the first reset module.

In short, during the positive scanning, the high level signal inputted from the positive input terminal INPUT_F is used as a scan signal, the high level signal inputted from the reverse input terminal INPUT_W is used as a reset signal, and during the reverse scanning, the high level signal inputted from the reverse input terminal INPUT_W is used as a scan signal, and the high level signal inputted from the positive input terminal INPUT_F is used as a reset signal, so that a bidirectional scanning is achieved. In contrast, in the prior art, the scan signal is only inputted from the positive input terminal, so that the pull-up node PU is charged through the first thin film transistor M1 and discharged through the second thin film transistor M2, the output terminal OUTPUT is discharged through the first reset module.

As a specific embodiment of the present invention, the first reset module 2 may comprise a fourth thin film transistor M4 and a fourteenth thin film transistor M14, as shown in FIG. 3, a gate of the fourth thin film transistor M4 is connected with the reverse input terminal INPUT_W, a first electrode of the fourth thin film transistor M4 is connected with the output terminal OUTPUT of the shift register unit, a second electrode of the fourth thin film transistor M4 is connected with the low level input terminal VSS. A gate of the fourteenth thin film transistor M14 is connected with the positive input terminal INPUT_F, a first electrode of the fourteenth thin film transistor M14 is connected with the output terminal OUTPUT of the shift register unit, a second electrode of the fourteenth thin film transistor M14 is connected with the low level input terminal VSS.

During the reset phase of the positive scanning, a high level signal is inputted from the reverse input terminal INPUT_W, the second thin film transistor M2 is turned on so that the pull-up node PU is discharged, the fourth thin film transistor M4 is turned on so that the output terminal OUTPUT is discharged. During the reset phase of the reverse scanning, a high level signal is inputted from the positive input terminal INPUT_F, the first thin film transistor M1 is turned on so that the pull-up node PU is discharged, the fourteenth thin film transistor M14 is turned on so that the output terminal OUTPUT is discharged.

The pull-up module is used for pulling up the level of the pull-up node PU. As a specific embodiment of the present invention, the pull-up module 1 may comprise a third thin film transistor M3, as shown in FIGS. 3 and 4, a gate of the third thin film transistor M3 is connected with the pull-up node PU, a first electrode of the third thin film transistor M3 is connected with a first clock signal input terminal CLK, and a second electrode of the third thin film transistor M3 is connected with the output terminal OUTPUT of the shift register unit. During the evaluation phase of the positive scanning and the evaluation phase of the reverse scanning, a high level signal is inputted from the first clock signal input terminal CLK, the third thin film transistor M3 is turned on, a high level signal is outputted from the output terminal OUTPUT, meanwhile, the electric potential of the pull-up node PU is further pulled up by bootstrap function of the storage capacitor C.

In order to reduce noise produced while scanning, the shift register unit may further comprise a second reset module, and the second reset module comprises: a fifth thin film transistor M5, a sixth thin film transistor M6, an eighth thin film transistor M8, a ninth thin film transistor M9, a tenth thin film transistor M10, an eleventh thin film transistor M11 and a twelfth thin film transistor M12. The second reset module is used for continuously discharging the pull-up node PU and the output terminal OUTPUT after reset of the pull-up node PU and the output terminal OUTPUT, until a high level signal is again outputted from the output terminal OUTPUT so that a gate line corresponding to the shift register unit is activated.

Specifically, as shown in FIGS. 3 and 4, a gate of the fifth thin film transistor M5 is connected with a pull-down control node PD_CN, a first electrode of the fifth thin film transistor M5 is connected with a second clock signal input terminal CLKB, a second electrode of the fifth thin film transistor M5 is connected with a pull-down node PD. A gate of the sixth thin film transistor M6 is connected with the pull-up node PU, a first electrode of the sixth thin film transistor M6 is connected with the pull-down node PD, and a second electrode of the sixth thin film transistor M6 is connected with the low level input terminal VSS. A gate of the eighth thin film transistor M8 is connected with the pull-up node PU, a first electrode of the eighth thin film transistor M8 is connected with the pull-down control node PD_CN, and a second electrode of the eighth thin film transistor M8 is connected with the low level input terminal VSS. A gate and a first electrode of the ninth thin film transistor M9 are connected with the second clock signal input terminal CLKB, and a second electrode of the ninth thin film transistor M9 is connected with the pull-down control node PD_CN. A gate of the tenth thin film transistor M10 is connected with the pull-down node PD, a first electrode of the tenth thin film transistor M10 is connected with the pull-up node PU, and a second electrode of the tenth thin film transistor M10 connected with the low level input terminal VSS. A gate of the eleventh thin film transistor M11 is connected with the pull-down node PD, a first electrode of the eleventh thin film transistor M11 is connected with the output terminal OUTPUT of the shift register unit, and a second electrode of the eleventh thin film transistor M11 is connected with the low level input terminal VSS. A gate of the twelfth thin film transistor M12 is connected with the second clock signal input terminal CLKB, a first electrode of the twelfth thin film transistor M12 is connected with the output terminal OUTPUT of the shift register unit, and a second electrode of the twelfth thin film transistor M12 is connected with the low level input terminal VSS.

During the reset phase of the positive scanning, a low level signal is inputted from the positive input terminal INPUT_F, and a high level signal is inputted from the reverse input terminal INPUT_W, so that the pull-up node PU and the output terminal OUTPUT are reset. Subsequently, a high level signal is inputted from the second clock signal input terminal CLKB, and a low level signal is inputted from the first clock signal input terminal CLK, the twelfth thin film transistor M12 and the ninth thin film transistor M9 are turned on, the eighth thin film transistor M8 and the sixth thin film transistor M6 are turned off, the pull-down control node PD_CN is at a high level, the fifth thin film transistor M5 is turned on, the pull-down node PD becomes at a high level, thus the tenth thin film transistor M10 and the eleventh thin film transistor M11 are turned on, the pull-up node PU and the output terminal OUTPUT are respectively pulled down to a low level. Therefore, during a non-evaluation phase, the pull-up node PU and the output terminal OUTPUT are continuously discharged. During the reset phase of the reverse scanning, a high level signal is inputted from the positive input terminal INPUT_F, a low level signal is inputted from the reverse input terminal INPUT_W, thus the pull-up node PU and the output terminal OUTPUT are reset. Subsequently, a high level signal is inputted from the second clock signal input terminal CLKB, a low level signal is inputted from the first clock signal input terminal CLK, and with the same principle as that during the positive scanning, the pull-up node PU and the output terminal OUTPUT are respectively pulled down to a low level.

As a preferable embodiment of the present invention, as shown in FIG. 4, the output terminal of the shift register unit may comprise a first output terminal and a second output terminal, the shift register unit may further comprise a fifteenth thin film transistor M15, a gate of the fifteenth thin film transistor M15 is connected with the pull-up node PU, a first electrode of the fifteenth thin film transistor M15 is connected with the first clock signal input terminal CLK, a second electrode of the fifteenth thin film transistor M15 is connected with the second output terminal OUTPUT_2, the second electrode of the third thin film transistor M3, the first electrode of the fourth thin film transistor M4, the first electrode of the eleventh thin film transistor M11, the first electrode of the twelfth thin film transistor M12 and the first electrode of the fourteenth thin film transistor M14 are connected with the first output terminal OUTPUT_1. The first output terminal is used for providing a scan signal to a load of the gate line, and during the reset phase of the positive scanning and the reset phase of the reverse scanning, voltage of the first output terminal is pulled down.

The shift register unit of the preset invention is described above. It can be seen that, by controlling signals of the positive control signal input terminal FW and the reverse control signal input terminal BW, during the positive scanning, the pull-up node PU can be charged from the positive control signal input terminal FW through the first thin film transistor M1, and after a high level signal is outputted from the output terminal of the shift register unit, the pull-up node PU is discharged to the reverse control signal input terminal BW through the second thin film transistor M2, and the first output terminal OUTPUT_1 is discharged to the low level input terminal VSS through the fourth thin film transistor M4.

During the reverse scanning, the pull-up node PU is charged from the reverse control signal input terminal BW through the second thin film transistor M2, and after a high level signal is outputted from the output terminal OUTPUT of the shift register unit, the pull-up node PU is discharged to the positive control signal input terminal FW through the first thin film transistor M1, and the first output terminal OUTPUT_1 is discharged to the low level input terminal VSS through the fourteenth thin film transistor M14. That is, during the positive scanning, the high level signal inputted from the positive input terminal is used as a scan signal, and the high level signal inputted from the reverse input terminal is used as a reset signal, and during the reverse scanning, the high level signal inputted from the reverse input terminal is used as a scan signal, and the high level signal inputted from the positive input terminal is used as a reset signal, so that a bidirectional scanning is achieved. In addition, the second output terminal of the shift register unit of the present invention is used for individually providing a scan signal and a reset signal, thus, in a case that a plurality of shift register unit are cascaded in multiple stages, an emergence of a delay for the output signal of the shift register unit being scanned later can be avoided, for example, a delay caused by using the output signal of the shift register unit in an upper stage to provide a trigger signal to the shift register unit in the next stage can be avoided, so that display quality of an image is improved.

Another aspect of the present invention provides a shift register comprising at least three stages of shift register units, and the shift register units are the above shift register units of the present invention, among the shift register units connected successively in three stages, the output terminal of the shift register unit in an intermediate stage is connected with the positive input terminal of the shift register unit in the next stage and the reverse input terminal of the shift register unit in the upper stage. In a case where the output terminal of the shift register unit in each stage comprises a first output terminal and a second output terminal, among the shift register units connected successively in three stages, the second output terminal of the shift register unit in an intermediate stage is connected with the positive input terminal of the shift register unit in the next stage and the reverse input terminal of the shift register unit in the upper stage.

Figure 5:
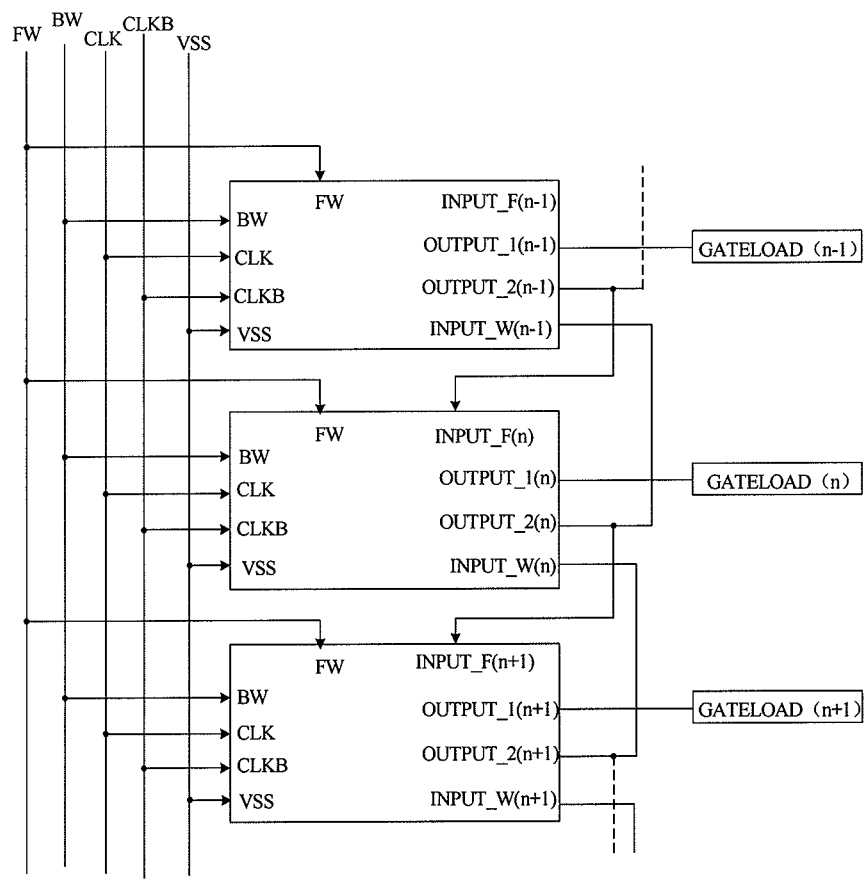
FIG. 5 shows a structural diagram of a shift register according to the present invention.

FIG. 5 shows a structural diagram of a shift register of the present invention.

As shown in FIG. 5, the second output terminal OUTPUT_2 of the shift register unit in $n^{th}$ stage is connected with the positive input terminal INPUT_F(n+1) of the shift register unit in $(n+1)^{th}$ stage and the reverse input terminal INPUT_W (n−1) of the shift register unit in $(n-1)^{th}$ stage. During the positive scanning, the second output terminal OUTPUT_2(n) of the shift register unit in $n^{th}$ stage is used for providing a trigger signal to the shift register unit in $(n+1)^{th}$ stage and providing a reset signal to the shift register unit in $(n-1)^{th}$ stage. During the reverse scanning, the second output terminal OUTPUT_2(n) of the shift register unit in $n^{th}$ stage is used for providing a trigger signal to the shift register unit in $(n-1)^{th}$ stage and providing a reset signal to the shift register unit in $(n+1)^{th}$ stage. Since the second output terminal of the shift register unit in each stage is used for individually providing a scan signal and a reset signal, for example, a delay caused by using the output signal of the shift register unit in $n^{th}$ stage to provide a trigger signal to the shift register unit in $(n+1)^{th}$ stage can be avoided, so that a phenomenon that a line (to be displayed) being scanned later cannot be displayed due to a delay of the output signal of the shift register unit in respective stages.

Procedures of the positive scanning and the reverse scanning in the shift register of the present invention will be described below in conjunction with FIGS. 6 and 7.

Figure 6:
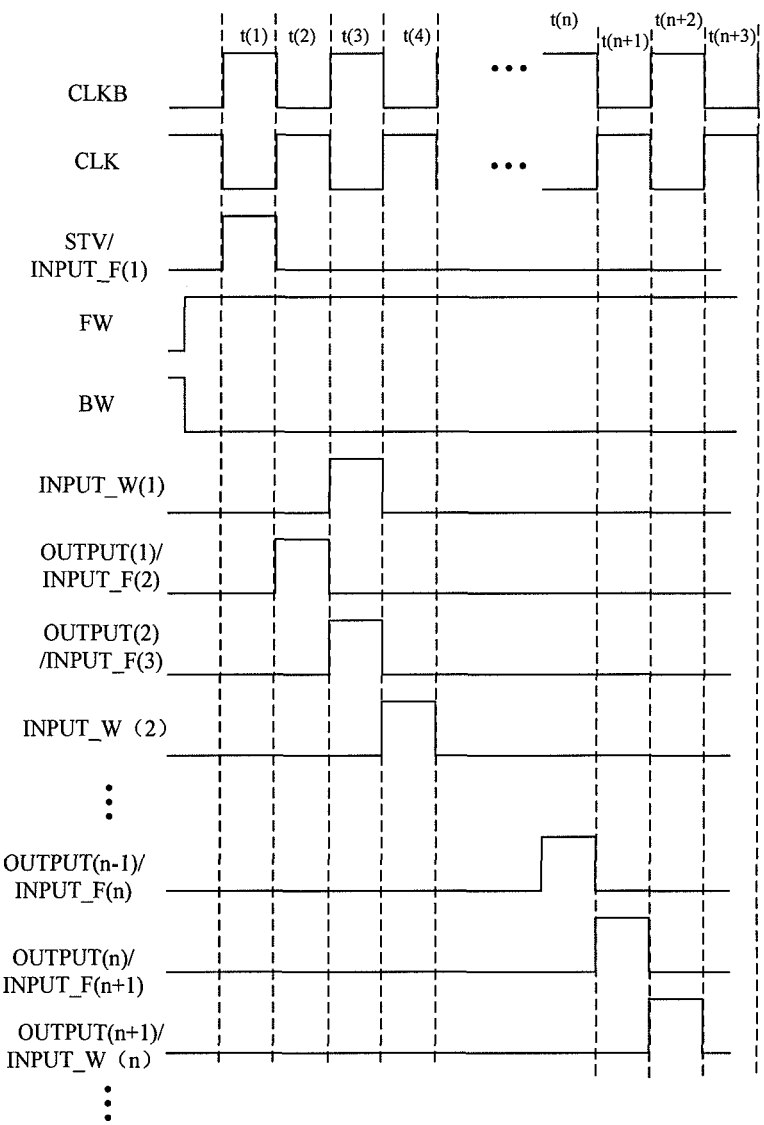
FIG. 6 shows a timing diagram of signals of the shift register during a positive scanning according to the present invention.

Take a shift register comprising shift register units connected in N stages as an example, timing of signals during the positive scanning is shown in FIG. 6. A high level signal is inputted from the positive control signal input terminal FW, and a low level signal is inputted from the reverse control signal input terminal BW, during a period of time t(1), a start signal STV is inputted from the positive input terminal INPUT_F(1) of the shift register unit in the first stage, a low level signal is inputted from the first clock signal input terminal CLK, and a high level signal is inputted from the second clock signal input terminal CLKB, at this time, the first thin film transistor M1 is turned on so that the pull-up node PU is charged. During a period of time t(2), a high level signal is inputted from the first clock signal input terminal CLK, potential of the pull-up node PU is further pulled up, the third thin film transistor M3 and the fifteenth thin film transistor M15 are turned on, a high level signal is outputted from the output terminal OUTPUT(1) (i.e., the first output terminal OUTPUT_1(1) and the second output terminal OUTPUT_2(1)), meanwhile, the output signal of the second output terminal OUTPUT_2(1) is inputted into the shift register unit in the second stage through the positive input terminal INPUT_F(2) of the shift register unit in the second stage. During a period of time t(3), a low level signal is inputted from the first clock signal input terminal CLK, a high level signal is outputted from the output terminal OUTPUT(2) (i.e., the first output terminal OUTPUT_1(2) and the second output terminal OUTPUT_2(2)), meanwhile, the output signal of the second output terminal OUTPUT_2(2) is inputted into the shift register unit in the first stage through the reverse input terminal INPUT_W(1) of the shift register unit in the first stage, the second thin film transistor M2 and the fourth thin film transistor M4 of the shift register unit in the first stage are turned on, the pull-up node PU and the first output terminal OUTPUT_1(1) are discharged respectively, that is, the pull-up node PU and the first output terminal OUTPUT_1(1) are reset. During a period of time t(4), a low level signal is inputted from the second clock signal input terminal CLKB, each of the pull-down control node PD_CN and the pull-down node PD are at a high level, the tenth thin film transistor M10 and the fourteenth thin film transistor M14 are turned on, the pull-up node PU and the first output terminal OUTPUT_1(1) are continuously discharged respectively, so that an emergence of noise is avoided. By that analogy, during a period of time t(n), a high level signal is outputted from the output terminal OUTPUT(n−1) (i.e., the first output terminal OUTPUT_1(n−1) and the second output terminal OUTPUT_2(n−1)) of the shift register unit in (n−1)$^{th}$ stage, that is, a high level signal is inputted from the positive input terminal INPUT_F(n) of the shift register unit in n$^{th}$ stage. During a period of time t(n+1), a high level signal is outputted from the output terminal OUTPUT(n) (i.e., the first output terminal OUTPUT_1(n) and the second output terminal OUTPUT_2(n)) of the shift register unit in n$^{th}$ stage, and during a period of time t(n+2), a high level signal is outputted from each of the first output terminal OUTPUT_1(n+1) and the second output terminal OUTPUT_2(n+1) of the shift register unit in (n+1)$^{th}$ stage, a low level signal is outputted from each of the first output terminal OUTPUT_1(n) and the second output terminal OUTPUT_2(n) of the shift register unit in n$^{th}$ stage.

Figure 7:
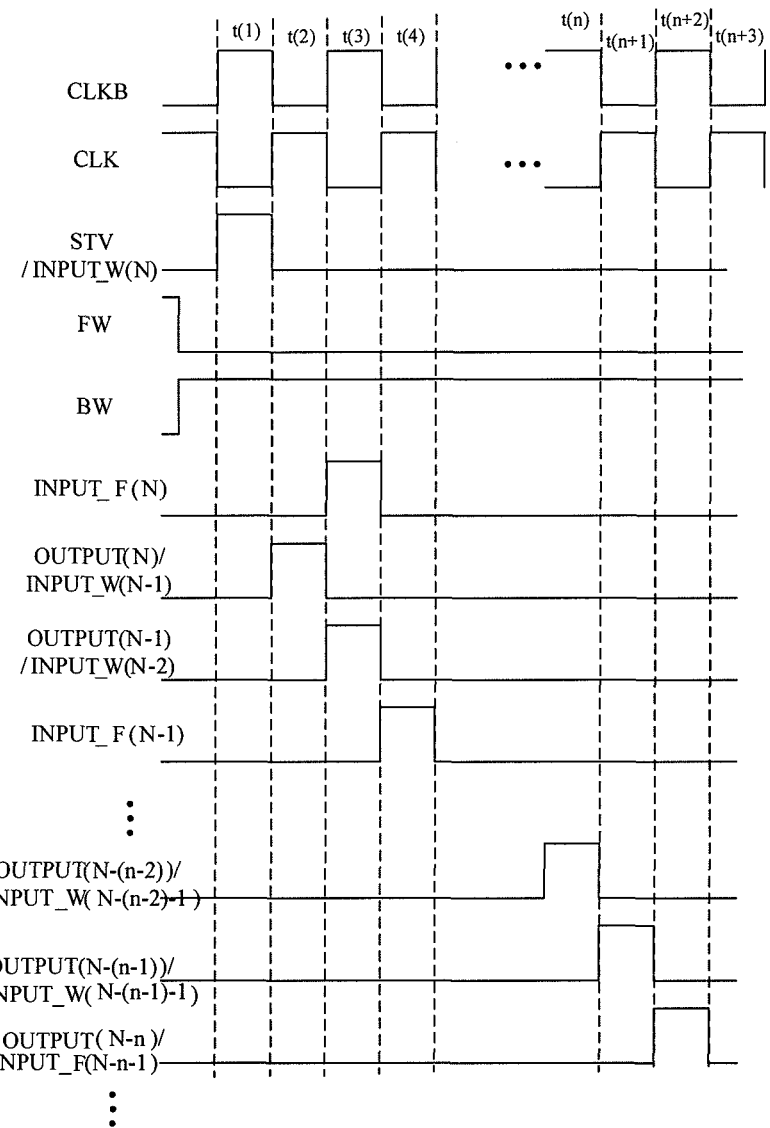
FIG. 7 shows a timing diagram of signals of the shift register during a reverse scanning according to the present invention.

During the reverse scanning, timing of signals is shown in FIG. 7. A low level signal is inputted from the positive control signal input terminal FW, and a high level signal is inputted from the reverse control signal input terminal BW, during a period of time t(1), a start signal STV is inputted from the reverse input terminal INPUT_W(N) of the shift register unit in N$^{th}$ stage (the last stage), a low level signal is inputted from the first clock signal input terminal CLK, and a high level signal is inputted from the second clock signal input terminal CLKB, at this time, the second thin film transistor M2 is turned on so that the pull-up node PU is charged. During a period of time t(2), a high level signal is inputted from the first clock signal input terminal CLK, potential of the pull-up node PU is further pulled up, the third thin film transistor M3 and the fifteenth thin film transistor M15 are turned on, a high level signal is outputted from the output terminal OUTPUT(N) (i.e., the first output terminal OUTPUT_1(N) and the second output terminal OUTPUT_2(N)), meanwhile, the output signal of the second output terminal OUTPUT_2(N) is inputted into the shift register unit in (N−1)$^{th}$ stage through the reverse input terminal INPUT_W(N−1) of the shift register unit in (N−1)$^{th}$ stage. During a period of time t(3), a low level signal is inputted from the first clock signal input terminal CLK, a high level signal is outputted from the output terminal OUTPUT(N−1) (i.e., the first output terminal OUTPUT_1(N−1) and the second output terminal OUTPUT_2(N−1)) of the shift register unit in (N−1)$^{th}$ stage, meanwhile, a high level signal is inputted from the positive input terminal INPUT_F(N) of the shift register unit in N$^{th}$ stage, the second thin film transistor M2 and the fourth thin film transistor M4 of the shift register unit in N$^{th}$ stage are turned on, the pull-up node PU and the output terminal OUTPUT (N) are discharged respectively, that is, the pull-up node PU and the output terminal OUTPUT (N) are reset. During a period of time t(4), a low level signal is inputted from the second clock signal input terminal CLKB, each of the pull-down control node PD_CN and the pull-down node PD are at a high level, the tenth thin film transistor M10 and the fourteenth thin film transistor M14 are turned on, the pull-up node PU and the output terminal OUTPUT (N) are continuously discharged respectively, so that an emergence of noise is avoided. By that analogy, during a period of time t(n), a high level signal is outputted from each of the first output terminal OUTPUT_1(N−(n−2)) and the second output terminal OUTPUT_2(N−(n−2)) of the shift register unit in (N−(n−2))$^{th}$ stage, that is, a high level signal is inputted from the reverse input terminal INPUT_W(N−(n−2)−1) of the shift register unit in (N−(n−2)−1)$^{th}$ stage. During a period of time t(n+1), a high level signal is outputted from each of the first output terminal OUTPUT_1(N−(n−1)) and the second output terminal OUTPUT_2(N−(n−1)) of the shift register unit in (N−(n−1))$^{th}$ stage, and during a period of time t(n+2), a high level signal is outputted from each of the first output terminal OUTPUT_1(N−n) and the second output terminal OUTPUT_2(N−n) of the shift register unit in (N−n)$^{th}$ stage.

In the present invention, both of n and N are integers more than 1.

Another aspect of the present invention provides a gate drive circuit comprising a shift register, wherein the shift register is the above shift register of the present invention.

Still another aspect of the present invention provides a display apparatus comprising a gate drive circuit, wherein the gate drive circuit is the above gate drive circuit of the present invention.

It should be understood that, the above embodiments are only used to explain the principle of the present invention, but not to limit the present invention. A person skilled in the art can make various variations and modifications without departing from spirit and scope of the present invention, and the variations and the modifications are also considered to be within the protection scope of the present invention.

The invention claimed is:

1. A shift register unit, characterized in that, comprising a positive control signal input terminal, a reverse control signal input terminal, a first thin film transistor, a second thin film transistor, a positive input terminal, a reverse input terminal, a pull-up module and a first reset module, a gate of the first thin film transistor is connected with the positive input terminal, a first electrode of the first thin film transistor is connected with the positive control signal input terminal, a second electrode of the first thin film transistor is connected with a pull-up node of the pull-up module, a gate of the second thin film transistor is connected with the reverse input terminal, a first electrode of the second thin film transistor is connected with the pull-up node of the pull-up module, a second electrode of the second thin film transistor is connected with the reverse control signal input terminal, wherein:

during a positive scanning, a high level signal is inputted from the positive control signal input terminal, and a low level signal is inputted from the reverse control signal input terminal,
during a pre-charging phase of the positive scanning, a high level signal is inputted from the positive input terminal, and a low level signal is inputted from the reverse input terminal,
during a reset phase of the positive scanning, a high level signal is inputted from the reverse input terminal; and
during a reverse scanning, a low level signal is inputted from the positive control signal input terminal, and a high level signal is inputted from the reverse control signal input terminal,
during a pre-charging phase of the reverse scanning, a high level signal is inputted from the reverse input terminal, and a low level signal is inputted from the positive input terminal,
during a reset phase of the reverse scanning, a high level signal is inputted from the positive input terminal.

2. The shift register unit of claim 1, characterized in that, the first reset module comprises a fourth thin film transistor and a fourteenth thin film transistor, wherein:

a gate of the fourth thin film transistor is connected with the reverse input terminal, a first electrode of the fourth thin film transistor is connected with an output terminal of the shift register unit, a second electrode of the fourth thin film transistor is connected with a low level input terminal; and
a gate of the fourteenth thin film transistor is connected with the positive input terminal, a first electrode of the fourteenth thin film transistor is connected with the output terminal of the shift register unit, a second electrode of the fourteenth thin film transistor is connected with the low level input terminal.

3. The shift register unit of claim 1, characterized in that, the pull-up module comprises a third thin film transistor, a gate of the third thin film transistor is connected with the pull-up node, a first electrode of the third thin film transistor is connected with a first clock signal input terminal, and a second electrode of the third thin film transistor is connected with the output terminal of the shift register unit.

4. The shift register unit of claim 1, characterized in that, the shift register unit further comprises a second reset module, and the second reset module comprises:

a fifth thin film transistor, a gate of the fifth thin film transistor being connected with a pull-down control node, a first electrode of the fifth thin film transistor being connected with a second clock signal input terminal, and a second electrode of the fifth thin film transistor being connected with a pull-down node;

a sixth thin film transistor, a gate of the sixth thin film transistor being connected with the pull-up node, a first electrode of the sixth thin film transistor being connected with the pull-down node, and a second electrode of the sixth thin film transistor being connected with the low level input terminal;
an eighth thin film transistor, a gate of the eighth thin film transistor being connected with the pull-up node, a first electrode of the eighth thin film transistor being connected with the pull-down control node, and a second electrode of the eighth thin film transistor being connected with the low level input terminal;
a ninth thin film transistor, a gate and a first electrode of the ninth thin film transistor being connected with the second clock signal input terminal, and a second electrode of the ninth thin film transistor being connected with the pull-down control node;
a tenth thin film transistor, a gate of the tenth thin film transistor being connected with the pull-down node, a first electrode of the tenth thin film transistor being connected with the pull-up node, and a second electrode of the tenth thin film transistor being connected with the low level input terminal;
an eleventh thin film transistor, a gate of the eleventh thin film transistor being connected with the pull-down node, a first electrode of the eleventh thin film transistor being connected with the output terminal of the shift register unit, and a second electrode of the eleventh thin film transistor being connected with the low level input terminal; and
a twelfth thin film transistor, a gate of the twelfth thin film transistor being connected with the second clock signal input terminal, a first electrode of the twelfth thin film transistor being connected with the output terminal of the shift register unit, and a second electrode of the twelfth thin film transistor being connected with the low level input terminal.

5. The shift register unit of claim 4, characterized in that, the output terminal of the shift register unit comprises a first output terminal and a second output terminal, the shift register unit further comprises a fifteenth thin film transistor, a gate of the fifteenth thin film transistor is connected with the pull-up node, a first electrode of the fifteenth thin film transistor is connected with the first clock signal input terminal, and a second electrode of the fifteenth thin film transistor is connected with the second output terminal,
the second electrode of the third thin film transistor, the first electrode of the fourth thin film transistor, the first electrode of the eleventh thin film transistor, the first electrode of the twelfth thin film transistor and the first electrode of the fourteenth thin film transistor are connected with the first output terminal.

6. A shift register, comprising at least three stages of shift register units, characterized in that, each of the shift register units is the shift register unit of claim 1, wherein, among the shift register units connected successively in three stages, an output terminal of the shift register unit in an intermediate stage is connected with the positive input terminal of the shift register unit in the next stage and the reverse input terminal of the shift register unit in the upper stage.

7. The shift register of claim 6, characterized in that, the output terminal of the shift register unit comprises a first output terminal and a second output terminal, and among the shift register units connected successively in three stages, the second output terminal of the shift register unit in an intermediate stage is connected with the positive input terminal of the shift register unit in the next stage and the reverse input terminal of the shift register unit in the upper stage.

8. A display apparatus, characterized in that, comprising the shift register of claim 6.

* * * * *